United States Patent [19]

Harkin et al.

[11] Patent Number: 5,744,823
[45] Date of Patent: Apr. 28, 1998

[54] ELECTRONIC DEVICES COMPRISING THIN-FILM CIRCUITRY

[75] Inventors: Gerard F. Harkin, London; Nigel D. Young, Red Hill, both of England

[73] Assignee: U.S. Philips Corporation, New York, N.Y.

[21] Appl. No.: 728,119

[22] Filed: Oct. 9, 1996

[30] Foreign Application Priority Data

Oct. 12, 1995 [GB] United Kingdom ............... 9520888

[51] Int. Cl.$^6$ ..................... H01L 27/108; H01L 29/04; H01L 29/76
[52] U.S. Cl. ..................... 257/68; 257/57; 257/67; 257/71; 257/300; 257/350
[58] Field of Search ................... 257/57, 67, 68, 257/71, 300, 350

[56] References Cited

U.S. PATENT DOCUMENTS

| | | | |
|---|---|---|---|
| 4,582,395 | 4/1986 | Morozumi | 350/334 |
| 4,623,908 | 11/1986 | Oshima et al. | |
| 5,130,829 | 7/1992 | Shannon | 359/59 |
| 5,396,084 | 3/1995 | Matsumoto | 257/72 |
| 5,517,543 | 5/1996 | Schleupen et al. | 377/79 |

FOREIGN PATENT DOCUMENTS

| | | |
|---|---|---|
| A0588425 | 9/1993 | European Pat. Off. |
| 04184424 | 7/1992 | Japan |
| 05142571 | 6/1993 | Japan |
| A06151307 | 5/1994 | Japan |

OTHER PUBLICATIONS

IEEE Journal of Solid–State Circuits vol. SC–14, No.: 6 Nov. 1979, pp. 1111 to 1114.

Pp. 438 to 441 of Physics of Semiconductor Devices 2nd Edition, by S.M. Sze, published by John Wile and Sons in 1981.

*Primary Examiner*—Ngân Ngô
*Attorney, Agent, or Firm*—John C. Fox

[57] ABSTRACT

A large-area electronic device such as, e.g, a large-area image sensor or flat panel display comprises thin-film drive circuitry including inverters each comprising a driver TFT (M1), a load TFT (M2) and a bootstrap capacitor ($C_s$). Most TFT types which may be used to fabricate the transistors (M1 and M2) have a high parasitic gate capacitance due, inter alia, to overlap of the gate electrode (g) with their source and drain electrodes (21 and 22). This parasitic capacitance degrades the inverter gain Av by coupling between the output line (O/P) of the inverter and the gate electrode (g) of its load device (M2) and an excessively large capacitor ($C_s$) is required to overcome this degradation. The present invention uses a reduction in the transconductance (gm2) of the load TFT (M2) to permit a reduction in the size of the boot strapping capacitor ($C_s$) to within practical limits, while still obtaining a desirably high gain Av from the inverter in spite of the parasitic capacitances. A factor μ.C in gm 2 of the load TFT (M2) is reduced for this purpose, for example by having a gate dielectric (24) of greater thickness (t2) or lower dielectric constant), and/or a lower crystallinity or amorphous material (α-Si) for the channel region (206). These same different materials or thicknesses as used for the driver and load TFTs (M1 and M2) may also be used to advantage in the bootstrap capacitor ($C_s$) and in a switch (M3) for the capacitor ($C_s$).

15 Claims, 4 Drawing Sheets

ELECTRONIC DEVICES COMPRISING THIN-FILM CIRCUITRY

BACKGROUND OF THE INVENTION

This invention relates to electronic devices comprising thin-film circuitry in which a driver transistor and a load transistor are coupled together as an inverter. The inverter may form part of a driving circuit for a thin-film array of the device. The device may be a large area image sensor, or a flat panel display (for example a liquid crystal display), or several other types of large-area electronic device (for example a data store or memory device, or a thermal imaging device).

Many such forms of electronic device comprising thin-film circuitry are known, in which a driver transistor and a load transistor are coupled together as an inverter, and in which both the driver and load transistors are thin-film field effect transistors (termed "TFTs") each having a respective gate electrode coupled capacitively to a respective channel region. The load transistor of such an inverter may have a lower transconductance than that of the driver transistor, and their ratio provides a desired gain from the inverter. The load transistor functions as a current source and/or active load. A common way of forming such a current source or active load in NMOS (n-channel insulated gate field effect transistor) technology is to use as the active load or current source an n-channel enhancement mode insulated-gate field-effect transistor having its control or gate electrode either coupled to its drain electrode or coupled to a separate potential higher than that supplied to the drain electrode.

Although often used in digital circuits, such current sources and inverter circuits may be used for analogue circuit applications, for example an amplifier as described in a paper by Hosticka entitled "Improvements of the gain of MOS amplifiers" published in the IEEE journal of Solid-State circuits Vol SC-14 No: 6 Nov. 1979, pages 1111 to 1114.

FIG. 1 of the accompanying drawings shows an inverter of this type which has been fabricated previously with TFTs in several forms of large-area electronic device. The inverter 1 comprises first and second voltage supply lines 2 and 3, an input signal line I/P for receiving an input signal to be inverted and an output signal line O/P for supplying an inverted output signal. The control or gate electrode g of an enhancement mode driver NMOS transistor M1 is coupled to the input signal line I/P. The first main electrode s of the driver TFT M1 is coupled to the first voltage supply line 2 while the second main electrode d of the driver TFT M1 is coupled via node 27 to the output supply line O/P and, via the load M2, to the second voltage supply line 3. As shown in FIG. 1 and as described in the aforementioned Hosticka paper, the load comprises an n-channel enhancement mode insulated-gate field-effect transistor M2 having its first electrode s coupled to the second electrode d of the driver transistor M1 via node 27. The control and second main electrodes g and d of M2 are coupled to the second voltage supply line 3.

The "small signal" gain Av of such an inverter 1 is given by the following equation:

$$Av = \frac{-gm1}{gm2} = -\sqrt{\frac{\frac{W1}{L1}}{\frac{W2}{L2}}} \quad (1)$$

where gm1 and gm2 are the mutual transconductances of the driver transistor M1 and the load transistor M2 respectively, and W1 and W2 are the widths and L1 and L2 are the lengths of the conduction channels of the driver and load transistors M1 and M2 respectively. Thus, the load transistor M2 should generally have a lower transconductance (gm2) than that (gm1) of the driver transistor M1, in order to achieve a small signal dc or low frequency gain Av greater than unity. The gain Av of the inverter circuit 1 shown in FIG. 1 exhibits a square root dependence on its transistor geometry, and so the driver transistor M1 needs to be considerably larger than the load transistor M2 to provide an appreciable gain. For example, assuming that the conduction channel lengths L1 and L2 of the two transistors M1 and M2 are the same, then the width W1 of the driver transistor M1 needs to be 100 times the width W2 of the load transistor M2 to provide a gain of 10.

The gain of the inverter circuit 1 will be poor because the voltage on the output line O/P will modulate the gate source voltage $V_{GS2}$ of the load transistor M2. This modulation causes a transconductance current to flow which thus lowers the load impedance and so results in a low output impedance.

As described in the Hosticka paper and as shown in FIG. 2 of the accompanying drawings, an amplifier circuit 2 comprising an inverter has previously been proposed, in which a capacitor $C_s$ is connected between the gate and source electrodes g and s of the load transistor M2. This circuit 2 is fabricated in single-crystal silicon NMOS monolithic integrated circuit (IC) technology, and not in NMOS thin-film circuitry technology. In operation of this inverter circuit 2, the capacitor $C_s$ is periodically charged to a certain value from a voltage supply line $V_s$ via a switch S1. When the switch S1 is opened, the capacitor $C_s$ holds the charge and acts to maintain the gate-source voltage $V_{gs}$ of the load transistor M2 constant. The load transistor M2 then simulates a constant current source (ignoring channel length modulation effects), because the load transistor M2 is in its saturation region. Reference may be made to any suitable text book (see for example pages 438 to 441 of Physics of Semiconductor Devices 2nd Edition, by S. M. Sze, published by John Wiley and Sons in 1981) for a definition of the saturation and linear regions of an insulated gate field effect transistor. This inverter circuit of FIG. 2 has an improved gain.

The small signal dc or low frequency gain Av of the inverter circuit 2, shown in FIG. 2 of the accompanying drawings, is given by Hosticka as:

$$Av = \frac{-gm1}{gds1 + gds2 + gds3} \quad (2)$$

where gds1 and gds2 are the respective output conductances of M1 and M2, and gds3 is the off conductance of S1. The factor gds3 is a measure of the off leakage of S1 and is generally very low, for example when S1 is formed by a switching transistor. Thus, it can be seen from equation (2) that the gain Av can be increased by reducing gds1 and gds2.

Unlike equation (1) for the inverter 1 of FIG. 1, the gain Av given by equation (2) for the inverter 2 of FIG. 2 does not include the mutual transconductance gm2 of the load transistor M2. Thus, for the FIG. 2 inverter 2, gm2 does not need to be smaller than gm1 of driver transistor M1 so that, for example, the width W1 of M1 does not need to be very much larger than W2 of M2. Hosticka gives experimental results in which all the transistors have identical geometry and in which the gain Av is increased by a factor of 3 by the inclusion of the bootstrap capacitor $C_s$.

Hosticka teaches that the capacitance value of $C_s$ must be very much larger than the associated parasitic (stray) capacitance $C_p$, but no relationship is given between Av and $C_p$. The Hosticka circuits were fabricated in single-crystal silicon monolithic IC technology.

As part of the work leading to the present invention, the present inventors investigated the effect of $C_p$ on Av, because with many types of TFT it is not practical to achieve very low parasitic capacitance values. The problematic parasitic capacitances prove to be the gate-drain capacitance $C_{gd}$ of M2 and (to a lesser extent) the gate-source capacitance $C_{gs}$ of S1 when S1 is a TFT.

Ideally, the capacitor $C_s$ behaves like a battery so that the voltage on the output line O/P no longer affects the gate source voltage $V_{gs}$ of the load transistor M2. However, in practice, the present inventors find that the voltage on the output line O/P couples a voltage onto the gate electrode of the load transistor M2 via the capacitance $C_s$ and the parasitic capacitance $C_p$ (where the parasitic capacitance $C_p$ comprises the intrinsic gate-drain capacitance $C_{gd}$ of the load transistor M2 and the gate-source capacitance $C_{gs}$ of the switch where the switch S is a transistor). According to the analysis of the present inventors, this coupling of the voltage on the output line O/P onto the gate electrode of the load device M2 alters the voltage at the capacitor $C_s$ and thus modulates the gate-source voltage $V_{gs}$ of the load transistor M2, so causing a transconductance current to flow in the load transistor M2. The ratio between the capacitance of the capacitor $C_s$ and the combined capacitances of the capacitor $C_s$ and the parasitic capacitance $C_p$ is defined by the present inventors as being equal to a coupling factor x, and so $$C_s/(C_s+C_p)=x \qquad (3)$$

Curve A of FIG. 3 of the accompanying drawings shows a graph of the small signal gain Av against the coupling factor $C_s/(C_s+C_p)$ for the case where gm1=gm2=10 micro amperes per volt, and gds1=gds2=100×10$^{-9}$ Siemens.

It can be seen from curve A that the maximum possible gain Av is 50 in this arrangement and that the gain drops to 40 for a coupling factor of 0.995 and to less than 10 for a coupling factor of 0.9. With a coupling factor of 0.995, the capacitance of the capacitor $C_s$ is about 200 times that of the parasitic capacitance $C_p$. When an insulated-gate field-effect transistor is in its saturation region, the channel region is pinched off at the drain region and accordingly the gate-drain capacitance $C_{gd}$ will be simply the capacitance resulting from the overlap between the gate electrode and the drain region. This overlap can be made quite small with single-crystal silicon monolithic integrated circuit technology, and so the circuit of FIG. 2 is quite practical in this case. However, with many types of TFT (e.g so-called "coplanar" or "staggered" or "inverted staggered" TFTs) in thin-film circuit technology, this gate-drain overlap can be quite significant, and very tight processing tolerances would be required to reduce it to a very small value. Accordingly, in practice for the inverter circuit 2 shown in FIG. 2 to provide a reasonable gain, the capacitor $C_s$ will need to have a relatively large value and therefore would occupy a very large area in the thin-film circuit. For this reason the FIG. 2 circuit is generally considered to be impractical for fabricating a large number of compact inverters with these TFT types in a large-area electronic device, for example in the thin-film driving circuit for a thin-film array.

SUMMARY OF THE INVENTION

The present invention is based on the above unpublished analysis by the present inventors and aims to provide in thin-film circuitry an inverter circuit which overcomes or at least mitigates the above-mentioned problems, including those recognised in the above analysis by the present inventors.

According to the present invention, there is provided an electronic device comprising thin-film circuitry, in which a driver transistor and a load transistor are coupled together as an inverter, both the driver and load transistors are thin-film field-effect transistors each having a respective gate electrode coupled capacitively to a respective channel region, a boot strapping capacitor is coupled between the gate electrode of the load transistor and a node at which a drain electrode of the driver transistor and a source electrode of the load transistor are coupled together, and the load transistor has a lower transconductance than that of the driver transistor, a factor μ.C in the transconductance of the load transistor being lower than that in the transconductance of the driver transistor, wherein for the load and driver transistors:

μ=charge-carrier mobility in the channel region of the respective transistor, and C=capacitance between the gate electrode and the channel region of the respective transistor.

Both the capacitance C between the gate electrode and channel region of a thin-film field-effect transistor and the charge carrier mobility μ in the channel region are parameters which can be controlled and changed in thin-film circuitry without incurring significant difficulties, even between the neighbouring drive and load transistors of an inverter circuit. By relatively adjusting the parameter C and/or the parameter μ of the driver and load transistors of the inverter, it is relatively easy for the factor μ.C in the transconductance gm2 of even a thin-film load transistor to be an order of magnitude lower than the factor μ.C in the transconductance gm1 of a thin-film driver transistor of the inverter. Surprisingly, the lower factor μ.C in the transconductance of the load transistor permits a high gain (Av) to be obtained without the boot strapping capacitor needing to occupy a large circuit area, even when the capacitive coupling factor x is not extremely close to one (e.g when x is only about 0.9). This significant improvement in gain Av with coupling factor x arises from the present inventors' unpublished analysis. Thus, the present inventors have found that the relationship between the parasitic capacitances $C_p$ in the coupling factor x and the small signal dc or low frequency gain Av of the inverter circuit 2 of FIG. 2 is given by:

$$Av = \frac{-gm1}{gds1 + gds2 + gm2(1-x)} \qquad (4)$$

Thus, in accordance with the present invention, a high gain Av can be achieved by reducing the factor gm2(1-x), by reducing the factor μ.C in the transconductance gm2 of the load transistor. This improvement in gain Av will be explained in more detail hereinafter with respect to curve B of FIG. 3 of the accompanying drawings.

The factor μ.C in the transconductance of the load transistor may be reduced relative to the driver transistor in a variety of ways. The channel region of the driver transistor may comprise semiconductor material of high crystallinity (e.g large-grain polycrystalline silicon), and the channel region of the load transistor may comprise less crystalline (e.g amorphous or microcrystalline or small-grain polycrystalline) semiconductor material which has a lower μ than the more crystalline semiconductor material of the driver transistor. Both semiconductor materials may be, for example, silicon. The more crystalline material may be obtained by laser-annealing the area of an amorphous silicon film where the driver transistor is to be formed, whereas another area of the film may be kept as, for example, amorphous material for the load transistor. The amorphous load-transistor area may be masked from the laser beam by an inorganic masking pattern on an insulating barrier layer on the semiconductor film. Alternatively by providing a seeding pattern on the substrate where the driver transistor areas are to be formed, the semiconductor film deposited on the substrate may grow as crystalline material on the seeding pattern and as amorphous material elsewhere.

The capacitance C between the gate electrode and channel region of the respective load and driver transistors is most easily controlled by choice of the gate dielectric layer between the gate electrode and channel region. The gate dielectric layer may comprise one or more dielectric materials. In order to provide the load transistor with a lower C than that of the driver transistor, the gate dielectric film of the load transistor may be thicker than that of the driver transistor. It is also possible for the gate dielectric film of the load transistor to comprise a material having a lower dielectric constant than that of the driver transistor, so as to provide the load transistor with a lower C than that of the driver transistor. Thus, for example, the gate dielectric film of the load transistor may be of silicon dioxide, whereas that of the driver transistor may be of silicon nitride.

By forming the gate dielectric film of the load transistor with a greater thickness and/or lower dielectric constant than that of the driver transistor, the overlap capacitance of the gate electrode with the source and drain of the load transistor is also reduced. This overlap capacitance is an important part of the parasitic capacitance $C_p$ in equation (3). By reducing the parasitic capacitance $C_p$ in this manner, the coupling factor x can more easily be kept high (closer to unity) in an inverter in accordance with the present invention. The different thin-film properties and/or materials used in the load and driver transistors (to give the different values of their respective factors $\mu.C$ in accordance with the present invention) may also be used with advantage in the design of a switch for charging the boot strapping capacitor and/or for the fabrication of the boot strapping capacitor itself.

Thus, for example, whereas the channel region of the driver transistor may comprise crystalline semiconductor material, both the channel region of the load transistor and one or more switching elements for charging the boot strapping capacitor may comprise less crystalline or amorphous semiconductor material. The use of amorphous semiconductor material for the switch is particularly advantageous in permitting any leakage current through the switch to be reduced to a low level, so maintaining the desired charge-state on the boot strapping capacitor. The switch may comprise an amorphous silicon thin-film field-effect transistor. In another form, the switch may comprise one or more amorphous silicon thin-film diodes.

The smaller thickness and/or higher dielectric constant of the gate dielectric material of the driver transistor may be used to reduce the layout area required for the boot strapping capacitor. Thus, the boot strapping capacitor may comprise a first area of a first dielectric film between an upper electrode and a lower electrode; the source electrode of the load transistor and the drain electrode of the driver transistor may be coupled to the lower electrode; the gate electrode of the driver transistor may be coupled to its channel region across a second area of the first dielectric film; the upper electrode of the boot strapping capacitor may be coupled to the gate electrode of the load transistor and the gate electrode of the load transistor may be coupled to its respective channel region across a second dielectric film. This second dielectric film may be thicker than the first dielectric film and/or may comprise a material having a lower dielectric constant than that of the first dielectric film.

It should be noted that in large-area electronic devices comprising a thin-film array of device elements, it is known to integrate a thin-film driving circuit for the array on the same device substrate as the array. In this case, it is also known to provide the thin-film field-effect transistors of the driving circuit with different characteristics from those of the device array. Thus, for example, the English language Abstract 04-184424 in Patent Abstracts of Japan, Vol 16, No 506 and the patent drawings of published Japanese Patent Application Kokai JP-A 04-184424 illustrate the fabrication of amorphous silicon thin-film transistors for the matrix array area, and polycrystalline silicon thin-film transistors for peripheral driving circuits. The polycrystalline silicon material is crystallised from amorphous material by scanning the peripheral driving circuit area with a laser beam. Similarly U.S. Pat. No. 5,396,084 illustrates fabricating NMOS thin-film transistors in the matrix area with a thicker gate dielectric film than the NMOS thin-film transistors in a peripheral circuit portion. By contrast, however, Abstract 05-142571 in the Patent Abstracts of Japan, Vol 17, No 526 and the patent drawings of published Japanese Patent Application Kokai JP-A 05-142571 illustrate forming the thin-film transistors of the peripheral driving circuit with a thicker gate dielectric film than the thin-film transistors of the matrix array.

It should also be noted that in a simple inverter circuit such as that of FIG. 1, it is also known from published Japanese Patent Application Kokai JP-A-06-151307 to reduce the size of the driver transistor M1 by forming the channel region of M1 with semiconductor material having a higher crystallinity than that of the channel region of M2. Thus, M1 has a higher transconductance gm1 than the transconductance gm2 of M2, due to a higher charge-carrier mobility $\mu$ in its channel region. In this way JP-A-06-151307 teaches forming a digital inverter 1 for a logic circuit (ie. with a gain of approximately unity) with TFTs M1 and M2 of the same size as each other.

BRIEF DESCRIPTION OF THE PREFERRED EMBODIMENTS

Features of the present invention, and their advantages, are illustrated specifically in embodiments of the invention now to be described, by way of example, with reference to the accompanying diagrammatic drawings, in which.

Figure 2:
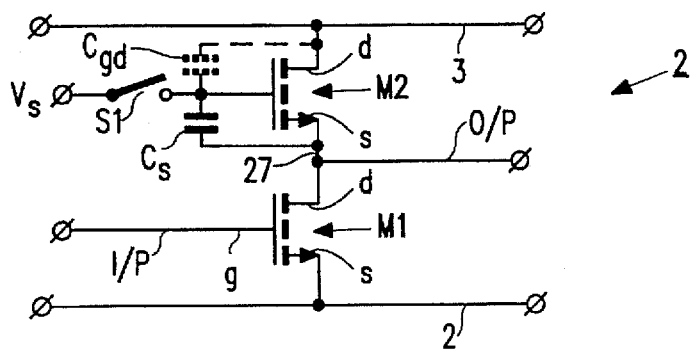
FIG. 2 is a circuit diagram of an inverter circuit in accordance with the present invention, comprising driver and load transistors and a boot strapping capacitor.
Figure 3:
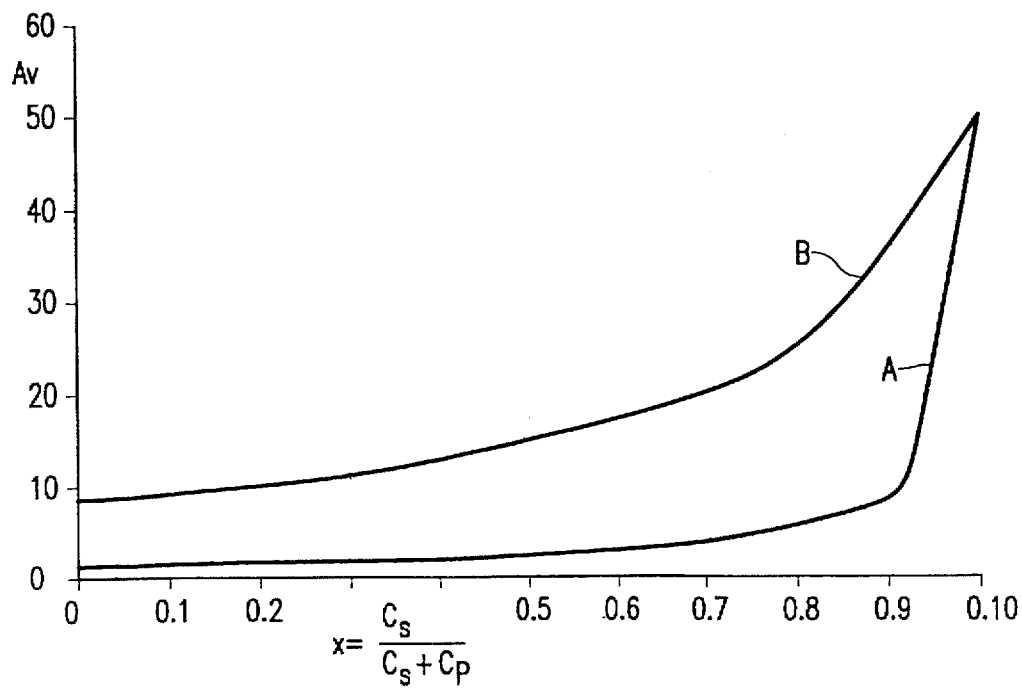
Figure 4:
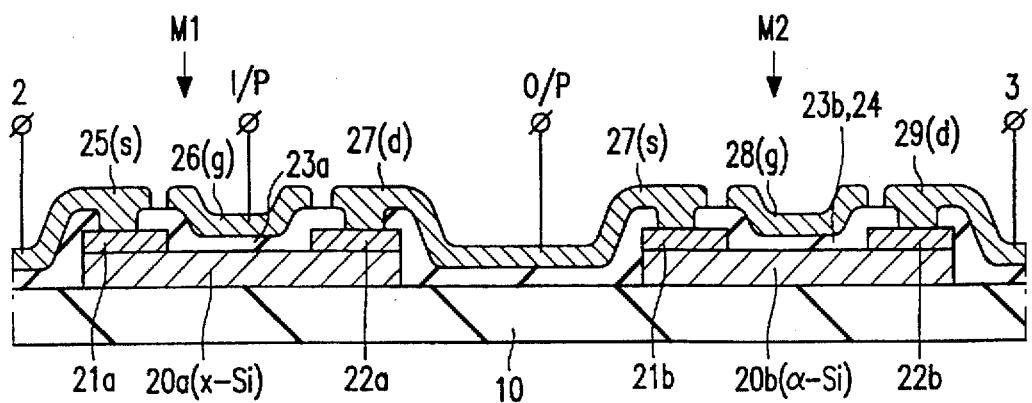
Figure 5:
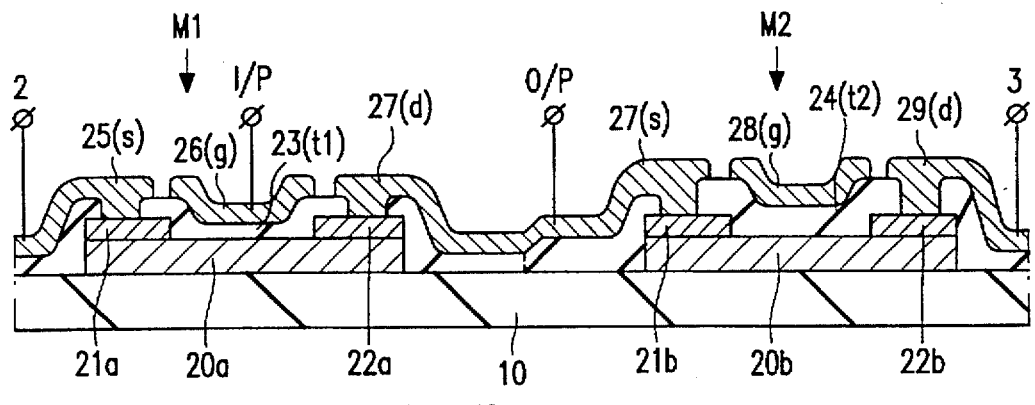
Figure 6:
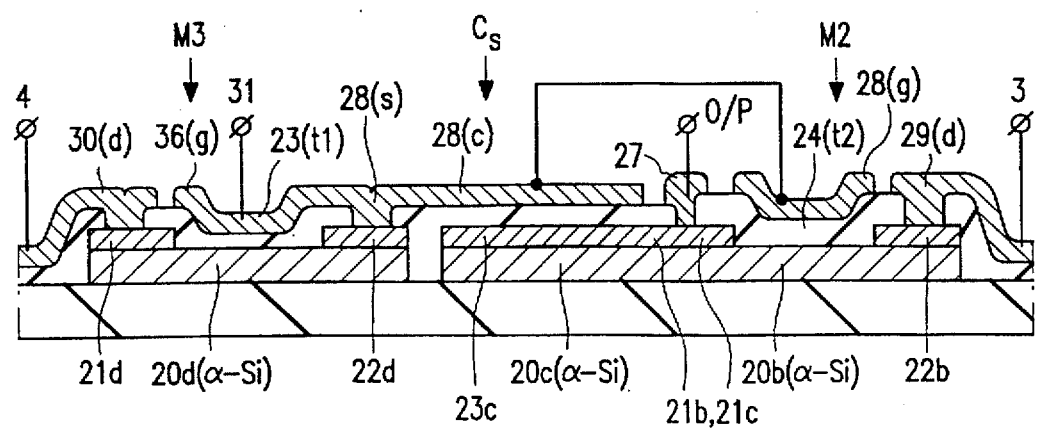
Figure 7:
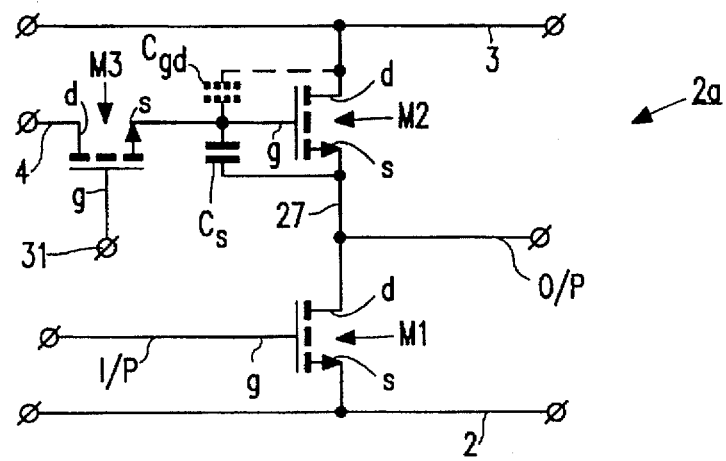
Figure 8:
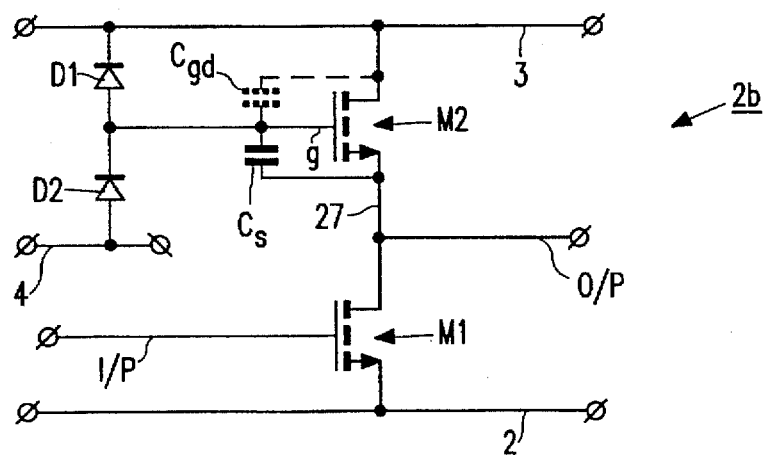
Figure 9:
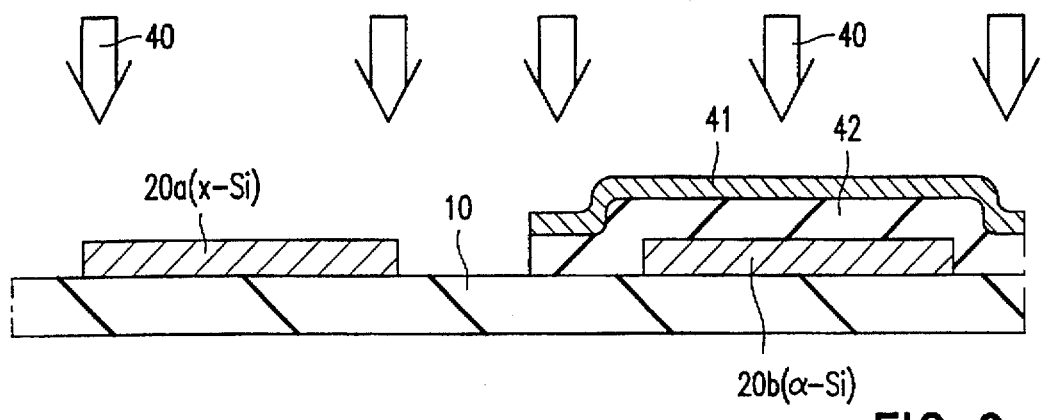
Figure 10:
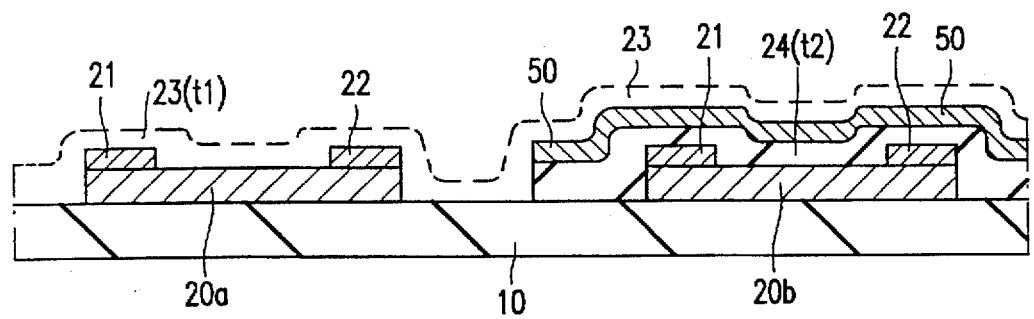
Figure 11:
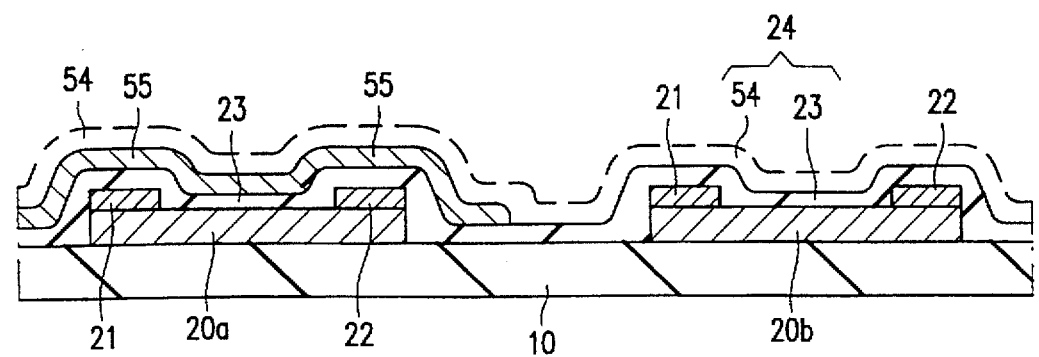

FIG. 3 is a graph of the small-signal dc or low-frequency gain Av against coupling factor x for the circuit of FIG. 2, curve A being for a prior art form of the circuit of FIG. 2, whereas curve B is for an embodiment of the circuit of FIG. 2 in accordance with the present invention, FIGS. 4 and 5 are cross-sectional views through the driver and load transistors of the inverter circuit of FIG. 2, illustrating the thin-film technology features by which the load transistor has a lower factor $\mu.C$ in its transconductance than the driver transistor, in accordance with the present invention;

FIG. 6 is a cross-sectional view through the load transistor, boot strapping capacitor and switching transistor of the inverter circuit of FIG. 2, showing further thin-film technology features in accordance with the present invention;

FIGS. 7 and 8 are circuit diagrams illustrating different embodiments of the inverter circuit of FIG. 2; and FIGS. 9 to 11 are cross-sectional views through the driver and load transistor areas of the embodiments of FIGS. 4 and 5, illustrating three different technology steps in the fabrication of such transistors.

It should be understood that, except for the graphs of FIG. 3, all the drawings are diagrammatic and not drawn to scale. Relative dimensions and proportions of parts of the cross-sectional views of FIGS. 4 to 6 and 9 to 11 have been shown exaggerated or reduced in size for the sake of clarity and convenience in the drawings. The same reference signs are generally used to refer to corresponding or similar features in the different embodiments.

Figure 1:
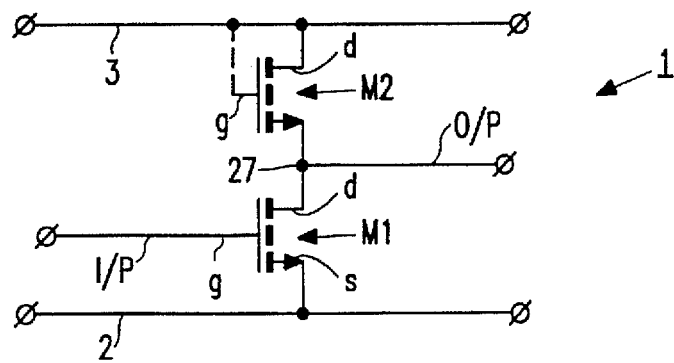
FIG. 1 is a circuit diagram of a simple inverter circuit not in accordance with the present invention.

As described previously, the simple inverter circuit 1 of FIG. 1 is of a type which has been fabricated previously with TFTs in several forms of large-area electronic devices. The inverter circuit 1 is not in accordance with the present invention.

The FIG. 2 inverter circuit with boot strapping capacitor $C_s$ is of the type described in the aforementioned Hosticka paper and has been fabricated previously with monocrystalline silicon monolithic integrated circuit technology. The present invention permits the realisation in thin-film technology of such an inverter circuit as that of FIG. 2, having a boot strapping capacitor of practical size.

The present invention provides an electronic device comprising thin-film circuitry (for example as in FIGS. 4 to 6), in which a driver transistor M1 and a load transistor M2 are coupled together as an inverter (for example as specifically illustrated in FIG. 2), both the driver and load transistors TFTs having a respective gate electrode g (26 of M1 and 28 of M2) coupled capacitively to a respective channel region (20a of M1 and 20b of M2). Most TFT types which may be used to fabricate the transistors M1 and M2 have a high parasitic gate capacitance due, inter alia, to overlap of the gate electrode g with their source and drain electrodes 21 and 22. This parasitic capacitance degrades the inverter gain Av by coupling between the output line O/P of the inverter and the gate electrode g of its load device M2. The present invention uses a reduction in the transconductance gm2 of the load TFT M2 (as compared with the driver TFT M1) to permit a reduction in the size of the boot strapping capacitor $C_s$ to within practical limits, while still obtaining a desirably high gain Av from the inverter 2 in spite of the parasitic capacitances.

The driver TFT M1 does not need to be considerably larger than the load TFT M2 in order to reduce the transconductance gm2 of the load TFT for this purpose. The present invention employs an additional factor for reducing gm2 with respect to gm1, namely a reduction in a factor $\mu.C$ in the transconductance gm2 of the load TFT M2. By this means, $\mu.C$ in gm2 may be an order of magnitude lower than $\mu.C$ in gm1 of the driver TFT M1.

The transconductance gm of each respective TFT M1 and M2 in its saturation region may be represented by the expression:

$$gm \propto \frac{W}{L} \cdot \mu \cdot C (V_G - V_T) \quad (5)$$

where, for each respective TFT M1 and M2,
W=width of the channel region,
L=length of the channel region,
$V_G$=voltage of the gate electrode, and
$V_T$=threshold voltage in the saturation region.

A fuller understanding and background to this expression (5) can be obtained with respect to, for example, equation (29) on page 442 of the aforementioned textbook "Physics of Semiconductor Devices" by S M Sze. As given in, for example, equation (28) on page 442 of this aforementioned textbook, the saturation current $I_D$ through the transistor can be represented by the expression:

$$I_D \propto \frac{W}{L} \cdot \mu \cdot C (V_G - V_T)^2 \quad (6)$$

By substituting for $(V_G - V_T)$ from expression (6) in expression (5), we obtain the relationship:

$$gm \propto \sqrt{\frac{W}{L} \cdot \mu \cdot C \cdot I_D} \quad (7)$$

The present invention uses a reduction in the transconductance gm2 of the load TFT M2 (as compared with the driver TFT M1) to reduce the size of bootstrap capacitor $C_s$ in the FIG. 2 circuit. This is achieved at least in part by a reduction in the factor $\mu.C$ for the load TFT M2 as compared with the driver TFT M1. In this way, gm1 of M1 can be an order of magnitude larger than gm2 of M2.

In order to achieve a difference in transconductance by a difference in the length and width of the channel regions of the TFTs, a large amount of layout area is required for the driver TFT M1, for example:

$$\frac{W1}{L1} = 100 \frac{W2}{L2} \quad (8)$$

for gm1=10 gm2.

However, a much smaller increase in layout area may be used, for example:

$$\frac{W1}{L1} = 10 \frac{W2}{L2} \quad (9)$$

when an order of magnitude reduction in the $\mu.C$ factor is employed, for example:

$$\mu1.C1 = 10\, \mu2.C2 \quad (10)$$

where $\mu1$ is the charge-carrier mobility in channel region 20a of M1, and $\mu2$ is the charge-carrier mobility in channel region 20b of M2. The capacitance C is dependent on the parameters of the gate dielectric film, of which either or both of its dielectric constant $\epsilon r$ and thickness t may be changed in thin-film technology. Thus, equation (10) may be re-written as:

$$\mu1 \cdot \frac{\epsilon r1}{t1} = 10\, \mu2 \cdot \frac{\epsilon r2}{t2} \quad (11)$$

where $\epsilon r1$ and $t1$ are the dielectric constant and thickness respectively of the gate dielectric film 23a of the driver TFT M1, and $\epsilon r2$ and $t2$ are the dielectric constant and thickness respectively of the gate dielectric film 23b or 24 of the load TFT M2. How these different parameters $\mu1$, $\mu2$, $\epsilon r1$, $\epsilon r2$, $t1$, $t2$ may be provided in accordance with the invention will be described later with respect to FIGS. 4 to 6 and 9 to 11.

The use of different parameters $\mu1$, $\mu2$, $\epsilon r1$, $\epsilon r2$, $t1$, $t2$ for the driver TFT M1 and load TFT M2 (as well as possibly for the switch S1 and for the bootstrapping capacitor $C_s$) is of particular importance for the boot strapped circuit of FIG. 2, the gain Av of which is given by equation (4). Thus, by reducing gm2 so as to be small with respect to gm1, the value of the coupling factor x (as given by equation (2)) which is necessary to reduce the factor gm2(1-x) further will also reduce.

Although the present invention may be used to form digital inverters 2 having a gain of about unity, it is particularly useful for forming analog amplifiers 2 having a gain of, for example, at least 20 and preferably higher, for example, a gain of 30 or 40, as illustrated by curve B in FIG. 3. These very high gains Av are achievable in inverters 2 in accordance with the present invention, even with practical-size bootstrapping capacitors $C_s$, for example having a capacitance value which is less than 20 times a total parasitic capacitance $C_p$ associated with the gate electrode g (of M2) to which it is coupled, i.e where the factor x of equation (3) is less than 0.95.

Curve B of FIG. 3 is a graph of the small signal gain Av with coupling factor x for a similar situation to that of curve A, except that:

gm1=10 gm2.

Thus, FIG. 4 relates to a situation in which:

gm1=10 micro amps per volt, gm2=1 micro amp per volt, and gds1=gds2=$100 \times 10^{-9}$ Siemens.

As is evident from a comparison of curves A and B, a much smaller value of x is necessary to achieve a given gain in the situation where gm1=10 gm2.

Thus, a gain Av of about 35 is obtained even when the coupling factor x is only about 0.9. A coupling factor x of 0.9 corresponds the boot strapping capacitor $C_s$ having a capacitance value which is only about 9 times that of the parasitic capacitances $C_p$. Thus, the present invention readily permits a boot strapping capacitor $C_s$ of acceptable layout area to be included in a FIG. 2 thin-film inverter circuit.

Particular embodiments in accordance with the present invention of the thin-film transistors and other circuit elements of the inverter circuit 2 of FIG. 2 will now be described with reference to FIGS. 4 to 6. The circuit is formed on an insulating substrate 10 of an electronic device. The device may be a liquid crystal display (LCD) or any other active matrix device, for example as described in published European Patent Application EP-A-0 588 425 (our reference PHB 33817) and/or in U.S. Pat. No. 5,130,829 (our reference PHB 33646). The whole contents of EP-A-0 588 425 and U.S. Pat. No. 5,130,829 are hereby incorporated herein as reference material. The inverter circuits formed in accordance with the present invention may be part of a thin-film driving circuit for a thin-film array also formed on the device substrate 10. Thus, for example, inverter circuits in accordance with the present invention may be used in the electronic drive circuits disclosed in EP-A-0 588 425.

By way of example, FIGS. 4 to 6 illustrate n-channel enhancement-mode thin-film field effect transistors of the so-called "co-planar" type. This type of TFT n-type source and drain electrode regions 21 and 22 respectively spaced apart on areas of an undoped silicon film 20 which provides the channel region of the transistor, and an insulated gate g is also formed at the same upper surface of the non-doped silicon film 20 between the source and drain regions 21 and 22.

However, the invention may be used with other known types of thin-film transistor, for example transistors of the so-called "staggered" type. In the so-called "staggered" type, the source and drain regions 21 and 22 are formed on the insulating substrate 10 before depositing the undoped channel-region film 20. The insulated gate structure g is then formed on the upper surface of the channel-region film 20, over the area between the source and drain electrodes 21 and 22. A so-called "inverted staggered" transistor structure is the inverse of this "staggered" structure, in that the insulated gate g is formed on the substrate 10 before the film 20, and the source and drain electrode regions 21 and 22 are formed on the film 20. Instead of forming the source and drain electrodes 21 and 22 as separate films, these regions 21 and 22 may be formed by doping areas of the undoped film 20.

The thin-film inverter circuit 2 in accordance with the present invention may be fabricated using known thin-film technologies and process steps, except where special measures are taken in accordance with the present invention in respect of the parameters μ1, μ2 of the channel region film 20 and/or er1,er2 of the dielectric film 23,24 and/or t1,t2 of the dielectric films 23,24 for M1, M2, S1, and $C_s$.

In the FIG. 4 embodiment of the inverter circuit in accordance with the present invention, the channel region 20a of the driver TFT M1 comprises highly crystalline semiconductor material X-Si, and the channel region 20b of the load TFT M2 comprises semiconductor material α-Si of lower (if any) crystallinity which has a lower μ than the material of M1. Typically hydrogenated amorphous silicon (sometimes designated as α-Si:H) is provided as the less crystalline material. The same amorphous semiconductor material α-Si may also be used to provide the switching element S1 of FIG. 2, M3 of FIG. 7, or D1 and D2 of FIG. 8. By using polycrystalline silicon for the channel region 20a and amorphous silicon for the channel region 20b of the n-channel TFTs M1 and M2, a factor of 100 in electron mobility between μ1 and μ2 can be readily achieved, i.e

μ1=100 μ2.

By changing in this way the electron mobilities μ1 and μ2 for M1 and M2 in the inverter circuit of FIG. 2, the improved gain Av illustrated in FIG. 3 can be readily achieved. Thus, a high gain Av can be achieved even with a lower coupling factor x, so permitting the boot strapping capacitor $C_s$ to be of a smaller capacitance value and hence of a smaller layout area. In this case, the improvement of curve B in FIG. 3 can be achieved without needing to change the dimensions of the channel regions 20a and 20b of TFTs M1 and M2 and without needing to change the gate dielectric film for the TFTs M1 and M2, i.e W1=W2, L1=L2, er1=er2, and t1=t2. However, the reduction of μ.C in the transconductance gm2 of the load TFT M2 may be achieved additionally or alternatively by changing the parameter C. Thus, in the FIG. 4 embodiment of the inverter circuit in accordance with the present invention, in addition to the different crystallinity X-Si and α-Si for the channel regions 20a and 20b, the TFTs M1 and M2 may comprise different dielectric films 23 and 24 respectively, across which their respective gate electrode g is capacitively coupled to their respective channel region 20a and 20b. Thus, the gate dielectric film 24 of the load TFT M2 may comprise a material having a lower dielectric constant than that of the driver TFT M1, so as to provide M2 with a lower C than M1. In a specific example, the dielectric film of the load TFT M2 may be of $SiO_2$, whereas the dielectric film 23 of the driver TFT M1 may be of $Si_3N_4$. The thicknesses of the films 23 and 24 may be substantially the same, although a further advantage can be obtained by making the film 24 of M2 thicker than the film 23 of M1.

FIG. 5 illustrates such an embodiment of an inverter circuit in accordance with the present invention, in which the gate dielectric film 24 of the load TFT M2 has a thickness t2 which is larger than the thickness t1 of the gate dielectric film 23 of the driver TFT M1. This difference in the thicknesses t1 and t2 also provides the load TFT M2 with a lower C (and hence a lower transconductance gm) than that of the driver TFT M1. In a specific example t2 of film 24 may be a factor of 10 larger than t1 of film 23.

If the difference in factor μ.C in the respective transconductances gm1 and gm2 of M1 and M2 is only achieved by changing the parameter C (by changing εr and/or t), then a change in layout area between the TFTs M1 and M2 may also be desirable (for example as in equation (8)) in order to achieve a desired difference in transconductances gm1 and gm2. However, such a change in size of M1 and M2 may not be necessary if the desired difference in factor μ.C is achieved by changing μ as described with reference to FIG. 4.

When different dielectric films 23 and 24 are used for the gate dielectrics of the driver TFT M1 and the load TFT M2, it is also advantageous to use the different film properties in order to reduce the layout area of the boot strapping capacitor $C_s$. Thus, FIG. 6 shows a cross-section through the load TFT M2, boot strapping capacitor $C_s$ and its switch M3 of the inverter circuit of FIGS. 2 and 6. The cross-section of FIG. 6 is therefore taken along a different line from the cross-section of FIG. 5. As can be seen by comparing the two parts of the device illustrated in FIGS. 5 and 6, the boot strapping capacitor $C_s$ comprises a first area 23c of the first dielectric film 23, between an upper electrode 28c and a lower electrode 21b,21c. The source electrode 21b of the load TFT M2 and the drain electrode 22a of the driver TFT M1 are coupled to this lower electrode 21b,21c. The gate electrode 26 of the driver TFT M1 is coupled to its channel region 28a across a second area 23a of the first dielectric film 23. The upper electrode 28c of the boot strapping capacitor $C_s$ is coupled to the gate electrode 28 of the load TFT M2. The gate electrode 28 of the load TFT M2 is coupled to its respective channel region 20b across the second dielectric film 24. This second dielectric film 24 may comprise a material having a lower dielectric constant εr than that of the first dielectric film 23 and/or may have a thickness t2 which is larger than that t1 of the first dielectric film 23. The use of the higher dielectric constant material 23 and/or the thinner dielectric material 23 for the boot strapping capacitor $C_s$ permits this boot strapping capacitor $C_s$ to be achieved in a more compact layout area.

The coupling factor x in the inverter circuit of FIG. 2 is given by equation (3). The present invention permits smaller boot strapping capacitors $C_s$ to be used, by reducing μ2 and/or εr2 and/or t1 with respect to ε1, εr1 and t2. When εr2 is reduced and/or t2 is increased with respect to εr1 and t1, the parasitic capacitance $C_p$ is also reduced, and so a further advantage is obtained for the coupling factor x. Thus, the parasitic capacitance $C_p$ comprises the capacitance formed across the dielectric film 24 between the gate g and drain 22b of the load TFT M2. Further parasitic capacitance is contributed by the switching element S1. FIGS. 7 and 8 illustrate two different forms of switching element S1.

In the embodiment of FIG. 7, the switching element S1 comprises a further n-channel enhancement-mode field-effect thin-film TFT M3.

The parasitic capacitance $C_p$ in the circuit of FIG. 7 comprises the capacitance formed between the source and gate electrodes 21d and 26 (g) of this switching TFT M3. The dimensions of this switching TFT M3 can be small compared with those of M1 and M2 and so the parasitic capacitance arising from capacitive overlap can also be small. However, if desired, the thick dielectric film 24 may be used for the gate dielectric of the switching TFT M3 so as to reduce this overlap capacitance.

Generally, the off state leakage current in a TFT having a hydrogenated amorphous silicon channel region is less than that in a TFT having a polycrystalline silicon channel region. A low leakage current for the switching TFT M3 is desirable in order to maintain the charge state on the boot strapping capacitor $C_s$. Therefore, as illustrated in FIG. 6, it is preferable for the channel region 20d of M3 to be formed of hydrogenated amorphous silicon material α-Si. The switching TFT M3 serves for periodically charging the boot strapping capacitor $C_s$ to a voltage level applied to the terminal 4 at the drain electrode connection 30 of the switching TFT M3. The periodic switching of M3 is controlled by a switching voltage applied to its gate terminal 31.

The TFTs M1 and M2 of FIGS. 4 to 6 and the TFT M3 and boot strapping capacitor $C_s$ of FIG. 6 may be formed in the following manner. The nature of the substrate 10 on which the thin-film circuitry is formed depends on the type of electronic device being manufactured. Typically, the substrate 10 may be of a low-cost insulative material, for example a glass or a polymer material capable of withstanding the processing temperatures. As the TFTs M1 to M3 in this particular example are all of the "co-planar" type a silicon film 20 is first deposited on the substrate 10, for providing the channel regions of the transistors. This silicon film 20 is of intrinsic conductivity, i.e it is not intentionally doped. Preferably the film 20 is of hydrogenated amorphous silicon material. The film 20 is patterned by etching to form islands for the individual thin-film transistors M1,M2,M3, . . . These silicon islands on the insulating substrate 10 are illustrated in FIG. 9.

FIG. 9 also illustrates the conversion of the silicon island for the driver TFT M1 into polycrystalline silicon material, while masking the island for the load transistor M2 against the conversion treatment. The masking pattern 41,42 is formed by depositing a thick insulating film over the island structure on the substrate 10 and then depositing an inorganic film 41 (of, for example, amorphous silicon or a metal) on the insulating layer. The inorganic film and insulating layer are patterned by etching to leave the films 41 and 42 over only those silicon islands (e.g for M2 and M3) which are to be retained as amorphous silicon material. The structure is then exposed to a laser beam 40 which is absorbed in the unmasked silicon islands and so heats the material of these unmasked islands to crystallise it as polycrystalline silicon. The masking film 41 in the masked areas either absorbs or reflects the laser beam 40, and the underlying insulating layer 42 is of sufficient thickness to mask the underlying silicon islands 20b, . . . against heating effects in the film 41.

A silicon film doped with arsenic or phosphorus so as to have an n-type conductivity is then deposited on the islands 20a,20b and on the substrate 10. This n-type silicon film is then patterned by etching to form the n-type source and drain electrode regions 21a and 22a on island 20a for TFT M1, to form n-type source and drain electrode regions 21b and 22b on island 20b for TFT M2, and to form n-type source and drain electrode regions 21d and 22d on island 20d for TFT M3. This n-type film may also be patterned to form the lower electrode 21b,21c of the boot strapping capacitor $C_s$. One or more dielectric films 23,24 are then deposited to provide the gate dielectric films of M1, M2 and M3 and also the dielectric 23c of the boot strapping capacitor $C_s$. After forming contact windows in the dielectric films, a metal film may be deposited and patterned to form gate electrodes 26 and 28 respectively of M1 and M2, gate electrode 36 of M3 and the upper electrode 28c of the $C_s$. From the same metal film pattern, there are also formed source and drain electrode connections 25 and 27 for M1, 27 and 29 for M2, and 28 and 30 for M3. The metal film part forming the gate 26 of driver TFT M1 forms the input terminal I/P, whereas the output terminal O/P is formed by the metal film pattern 27 which forms both the drain electrode connection of M1 and the source electrode connection of M2.

FIG. 10 illustrates a stage in the manufacture of an inverter circuit 2 having different gate dielectrics 23 and 24 for its TFTs M1 and M2. In the form illustrated in FIG. 10, the dielectric film 24 is first deposited over the semiconductor structure 20,21,22 on the insulating substrate 10 and is then patterned by etching so as to be left only on those transistor islands such as 20b where this dielectric film 24 is required. These remaining areas of the dielectric film 24 are covered with a masking film pattern 50 of, for example, amorphous silicon or chromium. The second dielectric film 23 is then deposited over the structure, and its desired pattern is defined by etching. During this etching treatment, the masking film pattern 50 serves as an etch-stop to prevent the removal of the dielectric film 24. Although FIG. 10 illustrates depositing the dielectric film 24 before the dielectric film 23, the opposite sequence can also be used. In this case, the masking pattern 51 would be provided as an etch-stop on the dielectric film 23 before depositing the dielectric film 24.

A modification is also possible in which the same masking pattern 41 is used as the etch-stop masking pattern 51. Thus, the crystallisation treatment for crystallising the silicon island 20a with a laser beam 40 may be carried out at the stage illustrated in FIG. 10, before depositing the second dielectric film 23. In this case, the amorphous silicon film 51 and the underlying thick insulating film 24 may mask the silicon island 20b from the laser heating treatment. After crystallising the silicon island 20a in this manner, the second dielectric film 23 may be deposited. The dielectric film 23 is then subsequently patterned by etching, using the laser masking film 51 as the etch-stop layer.

FIG. 11 illustrates yet another modification in which a thick gate dielectric film for the load TFT M2 is formed by depositing two films, instead of depositing a single film 24. In this case, the dielectric film 23 is first deposited on the semiconductor structure 20 to 21 on the insulating substrate 10. An etch-stop masking pattern 55 is then provided over the dielectric film 23 where a TFT (such as M1) with thin gate dielectric is to be formed. Subsequently a second dielectric film 54 is deposited and its pattern defined by etching so as to leave this second dielectric film 54 only over the areas where a thicker dielectric is required. Thus, for example, the second dielectric film 54 is left in the area of the load TFT M2 and switching TFT M3 but it is removed by etching from the area of the driver TFT M1. The etch-stop layer 55 protects the underlying dielectric film 23 during this etch-patterning of the dielectric film 54.

In the inverter circuit 2 of FIG. 7, the switching element S1 is a TFT M3. FIG. 8 shows an alternative arrangement in which the switching element S1 comprises a pair of switching diodes D1 and D2. As illustrated in FIG. 8 the diodes D1 and D2 may be connected between the voltage supply line 3 and a control line 4. The switching of the diodes D1 and D2 is controlled by a switching voltage applied to the control line 4. The diodes D1 and D2 may be formed as p-i-n thin-film diodes on the substrate 10. Thus, before depositing the undoped silicon layer 20, an electrode layer and then a p-type silicon layer may be deposited on the substrate 10 and at least partially patterned for forming the anode regions of the diodes D1 and D2 and their electrode connections. The silicon film 20 may then be deposited for forming the channel regions 20a,20b, . . . of the TFTs M1,M2, . . . and the intrinsic regions of the p-i-n diodes D1 and D2. Then an n-type silicon film may be deposited for forming the source and drain electrode regions 21 and 22 of the TFTs M1,M2, . . . and for forming the n-type cathode regions of the diodes D1 and D2. The anode electrode connections of the diodes D1 and D2 may be formed by parts of the metal film used to provide the source, drain and gate electrode connections 25 to 29 of the TFTs M1,M2, . . . The area of the silicon film 20 used for forming the intrinsic regions of the diodes D1 and D2 is preferably kept as hydrogenated amorphous semiconductor material α-Si, so as to provide the switching diodes D1 and D2 with a low leakage current.

From reading the present disclosure, other variations and modifications will be apparent to persons skilled in the art. Such variations and modifications may involve equivalent and other features which are already known in the design, manufacture and use of inverter circuits, semiconductor devices, thin-film transistors, and electronic devices comprising thin-film circuits, and component parts thereof, and which may be used instead of or in addition to features already described herein. Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The Applicants hereby give notice that new claims may be formulated to such features and/or combinations of such features during the prosecution of the present Application or of any further Application derived therefrom.

We claim:

1. An electronic device comprising thin-film circuitry, in which a driver transistor and a load transistor are coupled together as an inverter, both the driver and load transistors are thin-film field-effect transistors each having a respective gate electrode coupled capacitively to a respective channel region, a boot strapping capacitor is coupled between the gate electrode of the load transistor and a node at which a drain electrode of the driver transistor and a source electrode of the load transistor are coupled together, and the load transistor has a lower transconductance than that of the driver transistor, a factor $\mu.C$ in the transconductance of the load transistor being lower than that in the transconductance of the driver transistor, wherein for the load and driver transistors:

$\mu$=charge-carrier mobility in the channel region of the respective transistor, and C=capacitance between the gate electrode and the channel region of the respective transistor.

2. An electronic device as claimed in claim 1, wherein both the driver and load transistors comprise a respective dielectric film across which their respective gate electrode is capacitively coupled to their respective channel region, and the dielectric film of the load transistor is thicker than that of the driver transistor to provide the load transistor with a lower C than that of the driver transistor.

3. An electronic device as claimed in claim 1, wherein both the driver and load transistors comprise a respective dielectric film across which their respective gate electrode is capacitively coupled to their respective channel region, and the dielectric film of the load transistor comprises a material having a lower dielectric constant than that of the driver transistor to provide the load transistor with a lower C than that of the driver transistor.

4. An electronic device as claimed in claim 1, wherein the channel region of the driver transistor comprises crystalline semiconductor material, and the channel region of the load transistor comprises less crystalline or amorphous semiconductor material which has a lower µ than the crystalline semiconductor material of the driver transistor.

5. An electronic device as claimed in claim 1, wherein a switch for charging the boot strapping capacitor is coupled to the gate electrode of the load transistor, the channel region of the driver transistor comprises crystalline semiconductor material, and both the switch and the channel region of the load transistor comprise less crystalline or amorphous semiconductor material.

6. An electronic device as claimed in claim 1, wherein the boot strapping capacitor comprises a first area of a first dielectric film between an upper electrode and a lower electrode, the source electrode of the load transistor and the drain electrode of the driver transistor are coupled to the lower electrode, the gate electrode of the driver transistor is coupled to its channel region across a second area of the first dielectric film, the upper electrode of the boot strapping capacitor is coupled to the gate electrode of the load transistor, and the gate electrode of the load transistor is coupled to its respective channel region across a second dielectric film which is thicker than the first dielectric film.

7. An electronic device as claimed in claim 1, wherein the boot strapping capacitor comprises a first area of a first dielectric film between an upper electrode and a lower electrode, the source electrode of the load transistor and the drain electrode of the driver transistor are coupled to the lower electrode, the gate electrode of the driver transistor is coupled to its channel region across a second area of the first dielectric film, the upper electrode of the boot strapping capacitor is coupled to the gate electrode of the load transistor, and the gate electrode of the load transistor is coupled to its respective channel region across a second dielectric film which comprises a material having a lower dielectric constant than that of the first dielectric film.

8. An electronic device as claimed in claim 1, wherein the boot strapping capacitor has a capacitance value which is less than 20 times a total parasitic capacitance associated with the gate electrode to which it is coupled.

9. An electronic device as claimed in claim 1, wherein the inverter is an analog amplifier having a small signal gain of at least 20.

10. An electronic device as claimed in claim 1, further characterised in that the inverter forms part of a thin-film driving circuit for a thin-film array of the device.

11. An electronic device as claimed in claim 2, wherein both the driver and load transistors comprise a respective dielectric film across which their respective gate electrode is capacitively coupled to their respective channel region, and the dielectric film of the load transistor comprises a material having a lower dielectric constant than that of the driver transistor to provide the load transistor with a lower C than that of the driver transistor.

12. An electronic device as claimed in claim 2, wherein the channel region of the driver transistor comprises crystalline semiconductor material, and the channel region of the load transistor comprises less crystalline or amorphous semiconductor material which has a lower µ than the crystalline semiconductor material of the driver transistor.

13. An electronic device as claimed in claim 2, wherein a switch for charging the boot strapping capacitor is coupled to the gate electrode of the load transistor, the channel region of the driver transistor comprises crystalline semiconductor material, and both the switch and the channel region of the load transistor comprise less crystalline or amorphous semiconductor material.

14. An electronic device as claimed in claim 2, wherein the boot strapping capacitor comprises a first area of a first dielectric film between an upper electrode and a lower electrode, the source electrode of the load transistor and the drain electrode of the driver transistor are coupled to the lower electrode, the gate electrode of the driver transistor is coupled to its channel region across a second area of the first dielectric film, the upper electrode of the boot strapping capacitor is coupled to the gate electrode of the load transistor, and the gate electrode of the load transistor is coupled to its respective channel region across a second dielectric film which is thicker than the first dielectric film.

15. An electronic device as claimed in claim 2, wherein the boot strapping capacitor comprises a first area of a first dielectric film between an upper electrode and a lower electrode, the source electrode of the load transistor and the drain electrode of the driver transistor are coupled to the lower electrode, the gate electrode of the driver transistor is coupled to its channel region across a second area of the first dielectric film, the upper electrode of the boot strapping capacitor is coupled to the gate electrode of the load transistor, and the gate electrode of the load transistor is coupled to its respective channel region across a second dielectric film which comprises a material having a lower dielectric constant than that of the first dielectric film.

* * * * *